US011094586B2

(12) United States Patent
Choi et al.

(10) Patent No.: US 11,094,586 B2
(45) Date of Patent: Aug. 17, 2021

(54) SEMICONDUCTOR DEVICE INCLUDING INTERCONNECTIONS HAVING DIFFERENT STRUCTURES AND METHOD OF FABRICATING THE SAME

(71) Applicant: SAMSUNG ELECTRONICS CO., LTD., Suwon-si (KR)

(72) Inventors: Seung Hoon Choi, Yongin-si (KR); Jaeung Koo, Yongin-si (KR); Kwansung Kim, Yongin-si (KR); Bo Yun Kim, Hwaseong-si (KR); Wandon Kim, Seongnam-si (KR); Boun Yoon, Seoul (KR); Jeonghyuk Yim, Seoul (KR); Yeryung Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/539,064

(22) Filed: Aug. 13, 2019

(65) Prior Publication Data
US 2020/0243374 A1    Jul. 30, 2020

(30) Foreign Application Priority Data
Jan. 25, 2019    (KR) ........................ 10-2019-0009898

(51) Int. Cl.
*H01L 21/768*    (2006.01)
*H01L 27/105*    (2006.01)
(Continued)

(52) U.S. Cl.
CPC .... *H01L 21/7684* (2013.01); *H01L 21/31053* (2013.01); *H01L 21/76837* (2013.01);
(Continued)

(58) Field of Classification Search
CPC ............ H01L 21/7684; H01L 27/1052; H01L 21/76877; H01L 21/76837; H01L 23/5283;
(Continued)

(56) References Cited

U.S. PATENT DOCUMENTS 6,130,102 A * 10/2000 White, Jr. ......... H01L 27/10852
257/E21.009
6,255,151 B1 * 7/2001 Fukuda ............. H01L 27/10894
438/197
(Continued)

FOREIGN PATENT DOCUMENTS

KR         10-0881728 B1    2/2009
KR         10-0968424 B1    7/2010
KR     10-2018-0005607 A    1/2018

*Primary Examiner* — Steven H Loke
*Assistant Examiner* — Juanita B Rhodes
(74) *Attorney, Agent, or Firm* — Lee IP Law, P.C.

(57) ABSTRACT

A semiconductor device and a method of fabricating a semiconductor device, the semiconductor device including a semiconductor substrate including a first region and a second region; an interlayer insulating layer on the semiconductor substrate, the interlayer insulating layer including a first opening on the first region and having a first width; and a second opening on the second region and having a second width, the second width being greater than the first width; at least one first metal pattern filling the first opening; a second metal pattern in the second opening; and a filling pattern on the second metal pattern in the second opening, wherein the at least one first metal pattern and the second metal pattern each include a same first metal material, and the filling pattern is formed of a non-metal material.

20 Claims, 14 Drawing Sheets

(51) Int. Cl.
*H01L 23/528* (2006.01)
*H01L 23/532* (2006.01)
*H01L 21/3105* (2006.01)

(52) U.S. Cl.
CPC .... *H01L 21/76877* (2013.01); *H01L 23/5283* (2013.01); *H01L 23/5329* (2013.01); *H01L 23/53257* (2013.01); *H01L 27/1052* (2013.01); *H01L 21/76843* (2013.01)

(58) Field of Classification Search
CPC ........... H01L 23/53257; H01L 23/5329; H01L 21/31053; H01L 21/76843; H01L 2223/54426; H01L 23/544; H01L 21/3212; H01L 23/53252; H01L 23/5228; H01L 23/522; H01L 27/11531; H01L 27/11529; H01L 27/11519; H01L 27/11524; H01L 27/11565; H01L 27/1157; H01L 27/11573
See application file for complete search history.

(56) References Cited

U.S. PATENT DOCUMENTS

| | | | |
|---|---|---|---|
| 6,888,220 | B2 | 5/2005 | Akiyama |
| 7,781,336 | B2 | 8/2010 | Kim et al. |
| 7,893,472 | B2 | 2/2011 | Sashida et al. |
| 8,035,198 | B2 | 10/2011 | Ding et al. |
| 8,044,447 | B2 | 10/2011 | Okita et al. |
| 8,492,241 | B2 | 7/2013 | Cheng et al. |
| 8,941,089 | B2 | 1/2015 | Gopalan et al. |
| 9,735,050 | B2 | 8/2017 | Lin et al. |
| 2002/0135071 | A1 | 9/2002 | Kang et al. |
| 2003/0017669 | A1* | 1/2003 | Kiyotoshi ......... H01L 27/10852 438/245 |
| 2008/0048333 | A1* | 2/2008 | Seo ................... H01L 27/10876 257/773 |
| 2018/0012844 | A1 | 1/2018 | Ishizaka et al. |
| 2019/0237361 | A1* | 8/2019 | Usami ................. H01L 23/5226 |

* cited by examiner

SEMICONDUCTOR DEVICE INCLUDING INTERCONNECTIONS HAVING DIFFERENT STRUCTURES AND METHOD OF FABRICATING THE SAME

CROSS-REFERENCE TO RELATED APPLICATION

Korean Patent Application No. 10-2019-0009898, filed on Jan. 25, 2019, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

As semiconductor devices have been highly integrated, MOS field effect transistors have also been rapidly scaled down.

SUMMARY

The embodiments may be realized by providing a semiconductor device including a semiconductor substrate including a first region and a second region; an interlayer insulating layer on the semiconductor substrate, the interlayer insulating layer including a first opening on the first region and having a first width; and a second opening on the second region and having a second width, the second width being greater than the first width; at least one first metal pattern filling the first opening; a second metal pattern in the second opening; and a filling pattern on the second metal pattern in the second opening, wherein the at least one first metal pattern and the second metal pattern each include a same first metal material, and the filling pattern is formed of a non-metal material.

The embodiments may be realized by providing a semiconductor device including a semiconductor substrate including a first region and a second region; an interlayer insulating layer including a first trench on the first region, the first trench having a first width, and a second trench on the second region, the second trench having a second width that is greater than the first width; a first metal pattern filling the first trench; a second metal pattern filling a portion of the second trench; and a filling pattern filling a remaining portion the second trench having the second metal pattern therein, wherein the first metal pattern and the second metal pattern each include a metal material, the filling pattern includes a non-metal material, and a top surface of the filling pattern is closer to the semiconductor substrate than a top surface of the first metal pattern.

The embodiments may be realized by providing a method of fabricating a semiconductor device, the method including forming an interlayer insulating layer on a semiconductor substrate; forming a first trench and a second trench in the interlayer insulating layer such that the second trench has a width that is greater than a width of the first trench; forming a metal layer on the interlayer insulating layer such that the metal layer fills the first trench, covers an inner surface of the second trench, and defines a recess portion in the second trench; forming a filling layer on the metal layer such that the filling layer fills the recess portion of the second trench, the filling layer being formed of a non-metal material; and performing a planarization process on the filling layer and the metal layer to expose a top surface of the interlayer insulating layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
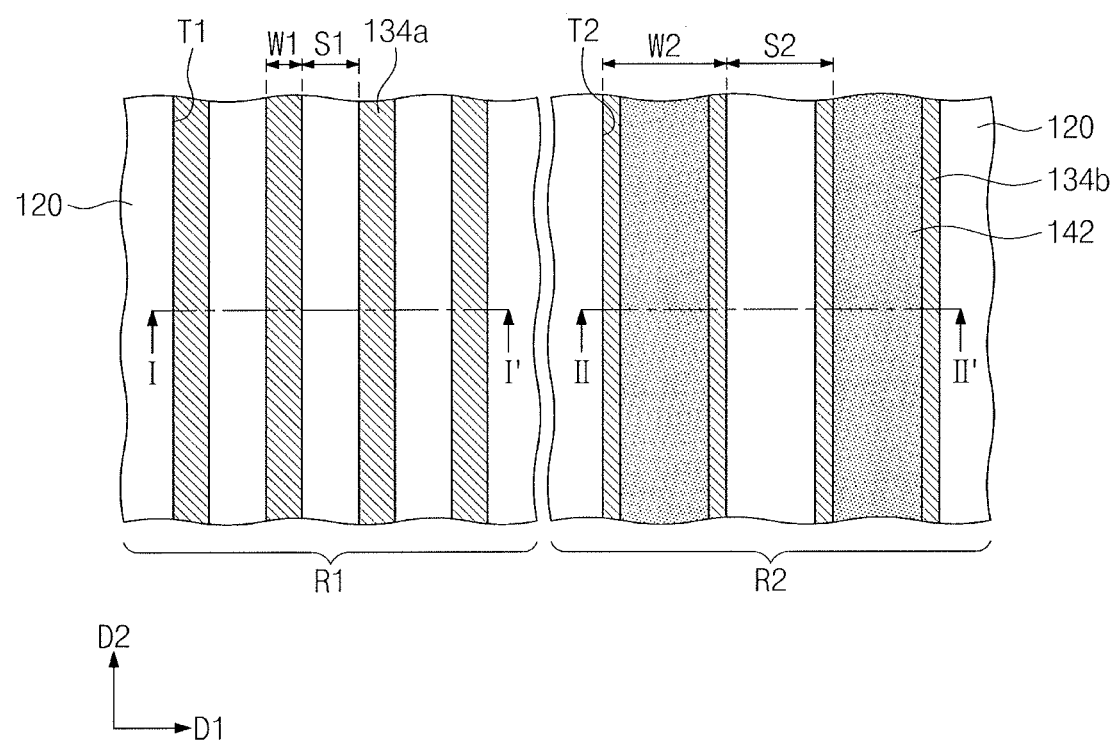
FIG. 1 illustrates a plan view of a semiconductor device according to some embodiments.

FIG. 1 illustrates a plan view of a semiconductor device according to some embodiments. FIGS. 2 to 6 illustrate cross-sectional views taken along lines I-I' and II-II' of FIG. 1 of stages in a method of fabricating a semiconductor device according to some embodiments. FIG. 7 illustrates a schematic view of a semiconductor apparatus used in a method of fabricating a semiconductor device according to some embodiments.

Figure 2:
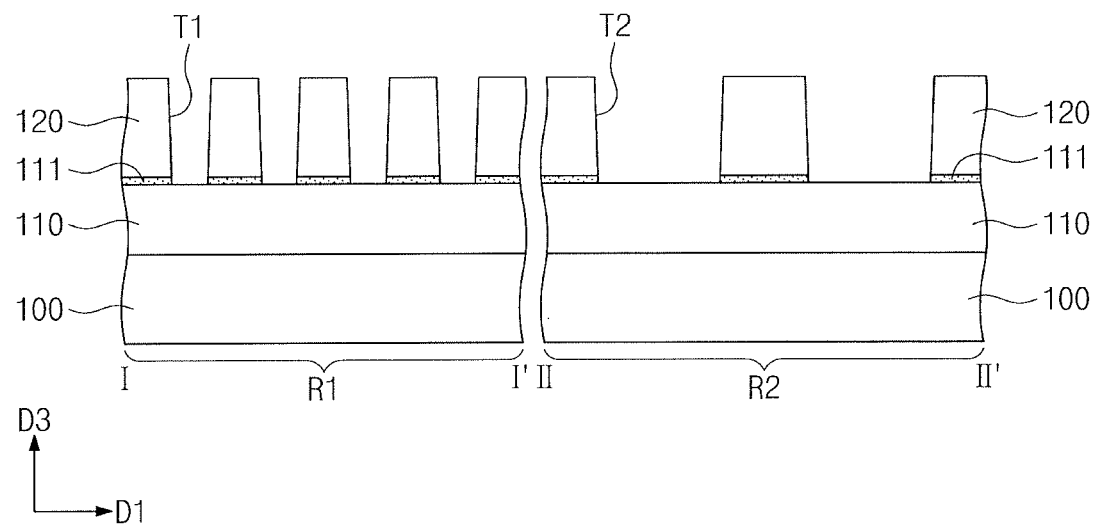
FIGS. 2 to 6 illustrate cross-sectional views taken along lines I-I' and II-II' of FIG. 1 of stages in a method of fabricating a semiconductor device according to some embodiments.

Referring to FIGS. 1 and 2, a semiconductor substrate 100 may include a first region R1 and a second region R2. The semiconductor substrate 100 may be, e.g., a silicon substrate, a germanium substrate, or a silicon-germanium substrate.

A lower layer 110 (including semiconductor components) may be formed on the semiconductor substrate 100. The lower layer 110 may include, e.g., conductive patterns and insulating layers. For example, the lower layer 110 may include MOS transistors, a capacitor, a resistor, contact plugs, and connection lines.

In an implementation, the lower layer 110 may include a high-density plasma (HDP) oxide layer, a tetraethylorthosilicate (TEOS) layer, a plasma enhanced tetraethylorthosilicate (PE-TEOS) layer, an $O_3$-tetraethylorthosilicate ($O_3$-TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, a Tonen silazene (TOSZ) layer, or any combination thereof. In an implementation, the lower layer 110 may be formed of a dielectric material having a dielectric constant lower than that of silicon oxide and may include at least one or more layers. For example, the lower layer 110 may be formed of fluorine-doped oxide (or fluorosilicate glass (FSG)), a carbon-doped oxide, silicon oxide, hydrogen silsesquioxane (SiO:H; HSQ), methyl silsesquioxane (SiO:CH3; MSQ), or a-SiOC (SiOC:H).

An interlayer insulating layer 120 may be on the lower layer 110, and an etch stop layer 111 may be between the lower layer 110 and the interlayer insulating layer 120. For example, the interlayer insulating layer 120 may be formed of an HDP oxide layer, a TEOS layer, a PE-TEOS layer, a USG layer, a BSG layer, a PSG layer, a BPSG layer, a SOG layer, a TOSZ layer, or any combination thereof. In an implementation, the interlayer insulating layer 120 may be formed of a low-k dielectric material of which a dielectric constant is lower than that of silicon oxide. In an implementation, the interlayer insulating layer 120 may have a dielectric constant of about 1.0 to about 3.0 and may include an organic material, an inorganic material, or an organic-inorganic hybrid material. In an implementation, the interlayer insulating layer 120 may be porous or non-porous. In an implementation, the interlayer insulating layer 120 may be formed of an impurity-doped silicon oxide-based material or a low-k organic polymer. In an implementation, the etch stop layer 111 may include an insulating material, e.g., SiN, SiON, SiC, SiCN, SiOCH, SiOC, or SiOF.

First trenches T1 may be formed in the interlayer insulating layer 120 on the first region R1. Second trenches T2 may be formed in the interlayer insulating layer 120 on the second region R2. For example, a mask pattern may be formed on the interlayer insulating layer 120, and then, the interlayer insulating layer 120 may be anisotropically etched using the mask pattern as an etch mask to form the first and second trenches T1 and T2.

The first and second trenches T1 and T2 may expose the lower layer 110 or the etch stop layer 111. In an implementation, the first and second trenches T1 and T2 may be formed at the same time, and depths of the first and second trenches T1 and T2 may be substantially equal to each other. In an implementation, the depth of the second trench T2 may be greater than the depth of the first trench T1.

The first trenches T1 may have line shapes extending in a second direction D2, may have a first width W1 (e.g., in a first direction D0, and may be spaced apart from each other by a first distance S1 (e.g., in the first direction D1). In an implementation, the first width W1 of the first trench T1 may be, e.g., about 1 nm to about 30 nm.

The second trenches T2 may have line shapes extending in the second direction D2 and may have a second width W2 (e.g., in the first direction D1) that is greater than the first width W1. The second trenches T2 may be spaced apart from each other by a second distance S2 (e.g., in the first direction D1) that is greater than the first distance S1. In an implementation, the second width W2 of the second trench 12 may be, e.g., about 50 nm to about 1,100 nm.

Figure 3:
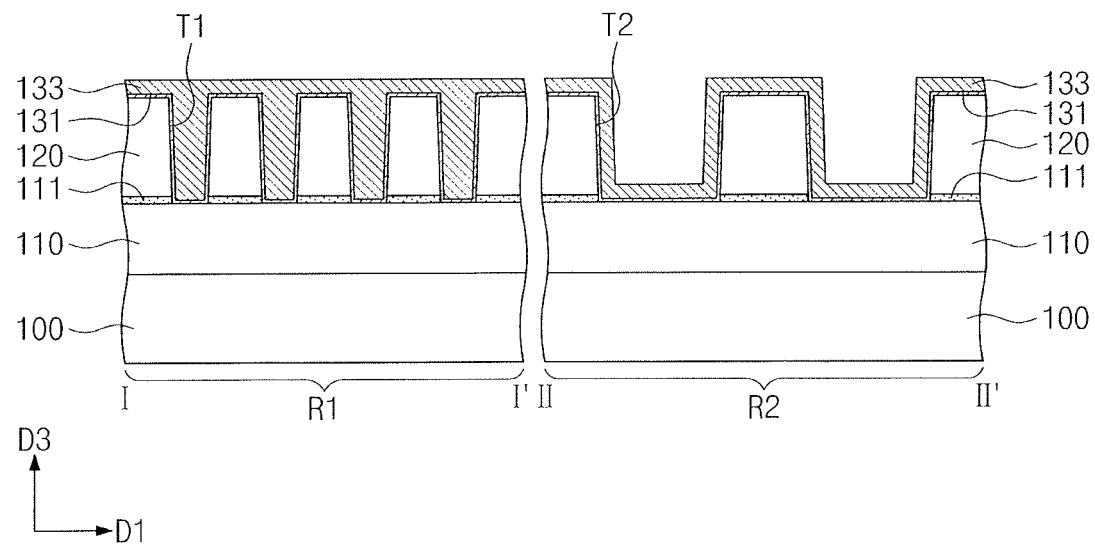

Referring to FIGS. 1 and 3, a barrier metal layer 131 and a metal layer 133 may be sequentially deposited on the interlayer insulating layer 120 having the first and second trenches T1 and T2 therein. The barrier metal layer 131 and the metal layer 133 may be formed using a layer-formation technique having an excellent property of step coverage, e.g., a chemical vapor deposition (CVD) technique, a physical vapor deposition (PVD) technique, or an atomic layer deposition (ALD) technique.

The barrier metal layer 131 may be formed with a substantially uniform thickness on a surface of the interlayer insulating layer 120 in which the first and second trenches T1 and T2 are formed. The barrier metal layer 131 may help reduce or prevent diffusion of the metal layer 133 formed in the first and second trenches T1 and T2 or may help improve adhesive strength between the interlayer insulating layer 120 and the metal layer 133. For example, the barrier metal layer 131 may be formed of Ta, TaN, TaSiN, Ti, TiN, TiSiN, W, WN, or any combination thereof. As used herein, the term "or" is not an exclusive term, and includes any individual or combination of listed elements. The barrier metal layer 131 may have a thickness of, e.g., about 1 Å to about 50 Å.

The metal layer 133 may be formed of a metal material. An electron mean free path in the metal material of the metal layer 133 may be less than the first width W1 of the first trench T1. In an implementation, the metal layer 133 may be formed of a noble metal material. In an implementation, the metal layer 133 may include, e.g., rhenium (Re), ruthenium (Ru), rhodium (Rh), palladium (Pd), silver (Ag), osmium (Os), iridium (Ir), platinum (Pt), or gold (Au).

In an implementation, the metal layer 133 may be formed of, e.g., ruthenium (Ru) having an electron mean free path of about 10.8 nm. A source gas used in depositing the metal layer 133 formed of ruthenium may include a ruthenium compound, e.g., ruthenium carbonyl ($Ru_3(CO)_{12}$), (cyclopentadienyl)(2,4-dimethylpentadienyl) ruthenium, bis(cyclopentadienyl)(2,4-methylpentadienyl) ruthenium, (2,4-dimethylpentadienyl)(ethylcyclopentadienyl) ruthenium, or bis(2,4-methylpentadienyl)(ethylcyclopentadienyl) ruthenium.

A deposition thickness of the metal layer 133 may be greater than about half of the first width W1 of the first trench T1 and may be less than the first width W1. For example, the deposition thickness of the metal layer may be DT in the following equation: $0.5\ W1 < DT < W1$. Thus, the metal layer 133 may partially fill the second trench T2, and a recess portion may be formed in the second trench T2 (e.g., at a portion of the second trench T2 that is not filled with the metal layer 133. When the metal layer 133 is deposited, a thickness of the metal layer 133 on a bottom surface of the second trench T2 may be substantially equal to a thickness of the metal layer 133 on a sidewall of the second trench T2.

Figure 4:
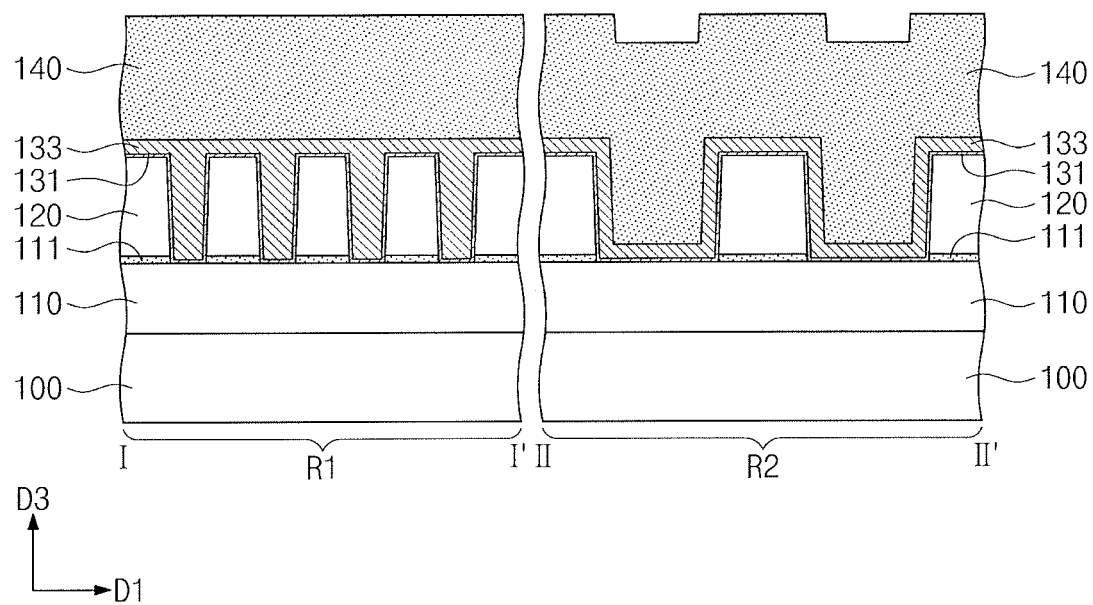

Referring to FIGS. 1 and 4, a filling layer 140 may be deposited on the metal layer 133. The filling layer 140 may be deposited to completely fill the remaining portions of the second trench T2 in which the metal layer 133 is formed. The filling layer 140 may be formed using a layer-formation technique having an excellent property of step coverage, e.g., a CVD technique, a IND technique, or an ALD technique. A deposition thickness of the filling layer 140 may be greater than about half of the second width W2 of the second trench T2.

The filling layer 140 may be formed of a material having a low selectivity with respect to the metal layer 133 in a first planarization process to be performed subsequently. The filling layer 140 may be formed of a different material from that of the metal layer 133. The filling layer 140 may be formed of a non-metal material. As used herein, the term "non-metal material" refers to a material that includes at least one element that is not a metal. For example, the non-metal material of the filling layer 140 may not include elemental, metallic metal (e.g., may not include pure copper or the like), and may include a metal compound or a material or compound that does not include a metal element. In an implementation, the filling layer 140 may include a ceramic material, e.g., TiN, or may be formed of a low-k dielectric material of which a dielectric constant is lower than that of the interlayer insulating layer 120.

In an implementation, the filling layer 140 may contain a first element (including, e.g., oxygen, nitrogen, or carbon) and a second element (including, e.g., a metal element or a semiconductor element). In an implementation, the filling layer 140 may include, e.g., a TiN layer, a silicon oxide layer, a SiN layer, a SiON layer, a SiC layer, a SiCN layer, a SiOCH layer, a SiOC layer, a SiOF layer, or any combination thereof.

After the deposition of the filling layer 140, a first planarization process may be performed on the filling layer 140, the metal layer 133, and the barrier metal layer 131. The first planarization process may be performed using a chemical mechanical polishing (CMP) process.

The first planarization process may be performed until a top surface of the interlayer insulating layer 120 is exposed. For example, in the first planarization process, the filling layer 140 and the metal layer 133 may be polished using first slurry at the same time. The first slurry may include uniformly dispersed oxide particles, an abrasive, a pH adjusting agent, and water. The first slurry may have a high polishing selectivity between the interlayer insulating layer 120 and the metal layer 133. For example, the abrasive in the first slurry may include silica, alumina, ceria, zirconia, or any combination thereof. In an implementation, the abrasive may include $SiO_x$, $Al_xO_y$, or $Ce_xO_y$, where each of 'x' and 'y' may be 1 to 5. The pH adjusting agent in the first slurry may include potassium hydroxide, ammonium hydroxide, or tetraalkylammonium hydroxide. The first slurry may be maintained at a pH of about 7 to about 14 in the first planarization process.

In the first planarization process, a polishing rate of the filling layer 140 may be similar to a polishing rate of the metal layer 133. In an implementation, in the first planarization process, a ratio of the polishing rate (Å/min) of the filling layer 140 to the polishing rate (Å/min) of the metal layer 133 may be, e.g., about 5:1 to about 1:5. In an implementation, in the first planarization process, the ratio of the polishing rate (Å/min) of the filling layer 140 to the polishing rate (Å/min) of the metal layer 133 may be about 1:1.

Figure 5:
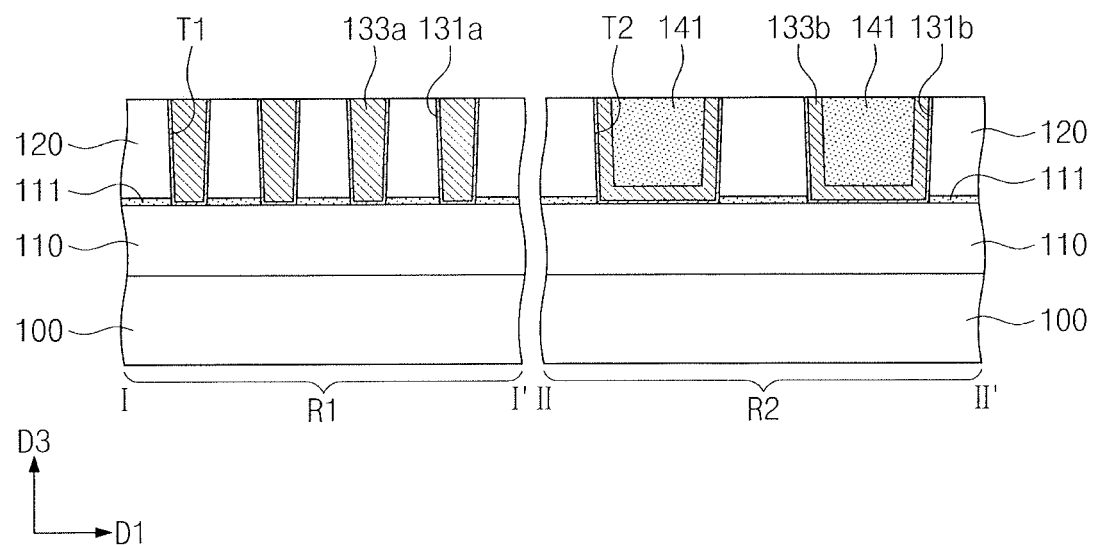

As illustrated in FIG. 5, by the first planarization process, a first preliminary barrier metal pattern 131a and a first preliminary metal pattern 133a may be formed in each of the first trenches T1, and a second preliminary barrier metal pattern 131b, a second preliminary metal pattern 133b, and a preliminary filling pattern 141 may be formed in each of the second trenches T2.

In an implementation, the filling layer 140 may fill the second trench T2 having the metal layer 133 during the first planarization process performed on the first and second regions R1 and R2 at the same time, and a polishing time of the metal layer 133 on the second region R2 may be reduced compared to an area occupied by the second trench T2. In addition, the filling layer 140 may be formed of the non-metal material, and it is possible to reduce or prevent occurrence of erosion between the metal layer 133 and the filling layer 140 on the second region R2 during the first planarization process.

The second trenches T2 (e.g., other than the portions filled with the barrier metal layer 131 and the metal layer 133) may be completely filled with the filling layer 140 while the first planarization process is performed on the first and second regions R1 and R2 at the same time, and a defect (e.g., a dishing phenomenon) of a planarization process may be reduced on the second region R2.

In an implementation, the filling layer 140 and the metal layer 133 may be polished simultaneously in the first planarization process. In an implementation, a planarization process may be performed on the filling layer 140 by using slurry having a high selectivity with respect to the metal layer 133, and then, a planarization process may be performed on the metal layer 133 by using slurry having a high selectivity with respect to the filling layer 140.

Figure 6:
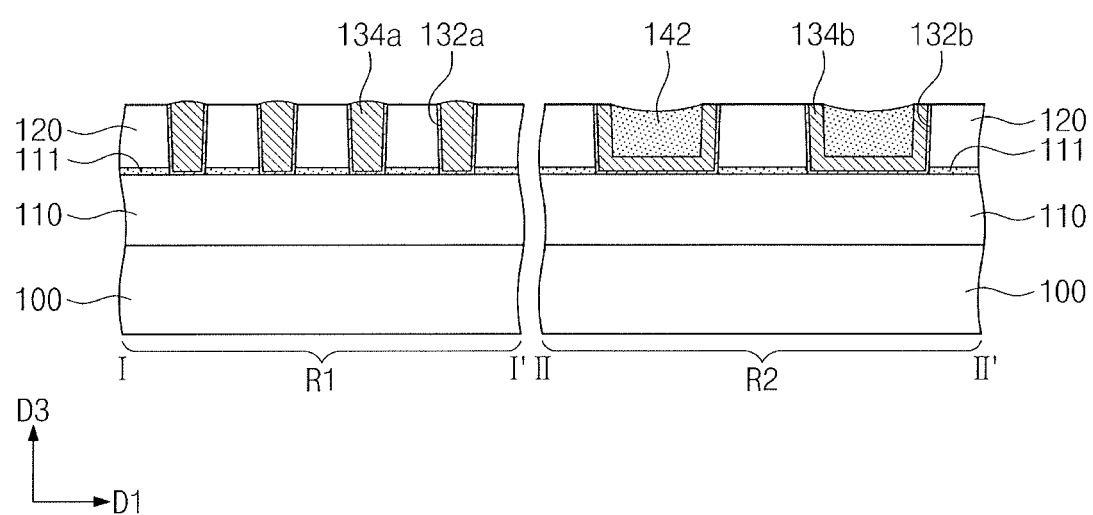
Figure 7:
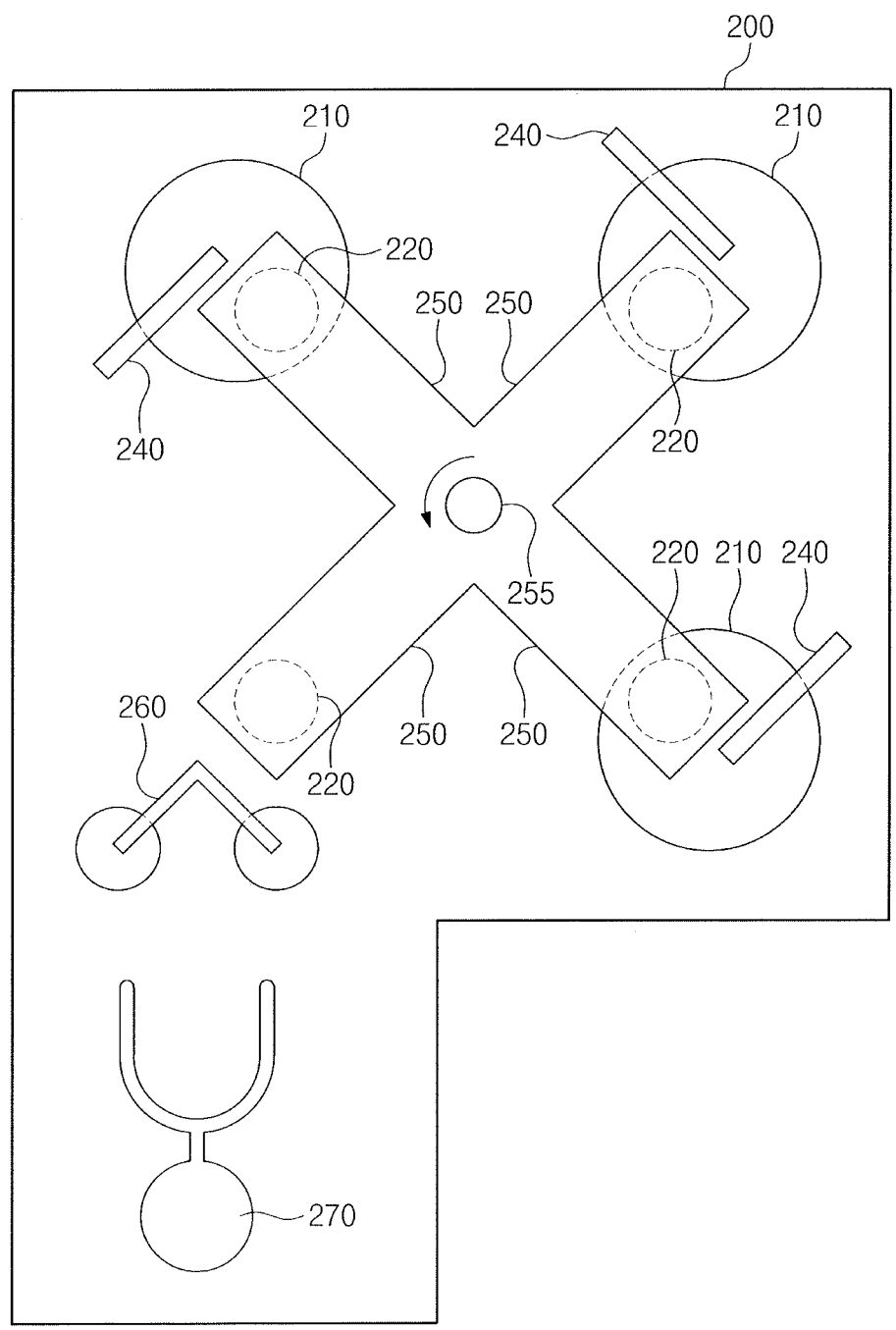
FIG. 7 illustrates a schematic view of a semiconductor apparatus used in a method of fabricating a semiconductor device according to some embodiments.

Referring to FIGS. 1 and 6, a second planarization process may be performed on the interlayer insulating layer 120, the preliminary filling pattern 141 the first and second preliminary metal patterns 133a and 133b, and the first and second preliminary barrier metal patterns 131a and 131b.

A second slurry may be used in the second planarization process. The second slurry may not have a polishing selectivity between the preliminary filling pattern 141, the first and second preliminary metal patterns 133a and 133b, the first and second preliminary barrier metal patterns 131a and 131b, and the interlayer insulating layer 120. For example, the second planarization process may reduce thicknesses (or heights) of the preliminary filling pattern 141, the first and second preliminary metal patterns 133a and 133b, the first and second preliminary barrier metal patterns 131a and 131b and the interlayer insulating layer 120.

As illustrated in FIGS. 1 and 6, by the second planarization process, a first barrier metal pattern 132a and a first metal pattern 134a may be formed in each of the first trenches T1, and a second barrier metal pattern 132b, a second metal pattern 134b and a filling pattern 142 may be formed in each of the second trenches T2. The second metal pattern 134b may include a bottom portion covering the bottom surface of the second trench T2 and a sidewall portion extending from the bottom portion to cover the sidewall of the second trench T2. In an implementation, a thickness of the bottom portion may be greater than about half of the first width W1 of the first trench T1 and may be less than the first width W1 of the first trench T1. For example, the thickness of the bottom portion of the second metal pattern 134b may be DT' in the following equation: $0.5\ W1 < DT' < W1$.

A metal material remaining on a surface of the interlayer insulating layer 120 between the first metal patterns 134a may be removed by the second planarization process, and an electrical short between the first metal patterns 134a may be prevented.

A polishing rate of the first and second metal patterns 134a and 134b may be the lowest in the second planarization process. For example, a top surface (e.g., surface facing away from the semiconductor substrate 100) of the first metal pattern 134a may be located at a higher level (e.g., may be farther from the semiconductor substrate 100 in a third direction D3) than a top surface of the interlayer insulating layer 120. The first metal pattern 134a may have a rounded top surface that is upwardly convex (e.g., away from the semiconductor substrate 100 in the third direction D3). Highest points (e.g., points of the first metal patterns 134a that are farthest from the semiconductor substrate 100 in the third direction D3) of the top surfaces of the first metal patterns 134a may be located at a higher level (e.g., farther from the semiconductor substrate 100) than the top surface of the interlayer insulating layer 120.

In the second planarization process, a polishing rate of the filling pattern 142 may be greater than the polishing rate of the first and second metal patterns 134a and 134b. For example, a dishing phenomenon may occur at a top surface of the filling pattern 142 on the second region R2. Thus, the filling pattern 142 may have a rounded top surface that is downwardly concave (e.g., toward the semiconductor substrate 100 in the third direction D3). A lowest point of the top surface of the filling pattern 142 may be located at a lower level than (e.g., closer to the semiconductor substrate 100 than) the top surface of the interlayer insulating layer 120.

In an implementation, the first and second trenches T1 and T2 having the line shapes may be formed on the first and second regions R1 and R2. In an implementation, openings having polygonal shapes may be formed on the first and second regions R1 and R2 instead of the first and second trenches T1 and T2.

In an implementation, the first metal patterns 134a on the first region R1 may be metal interconnection lines connected to semiconductor memory components or logic components. The second metal patterns 134b on the second region R2 may form peripheral logic components (e.g., a diode, a resistor, a capacitor, or an inductor), conductive pads, an alignment key, or a photo key.

FIG. 7 illustrates a schematic view of a semiconductor apparatus used in a method of fabricating a semiconductor device according to some embodiments.

A semiconductor apparatus illustrated in FIG. 7 may be a chemical mechanical polishing (CMP) apparatus that includes a plurality of platens and is used in the method of fabricating a semiconductor device according to some embodiments.

Referring to FIG. 7, the semiconductor apparatus may include a process chamber 200, three platens 210, four polishing heads 220, four polishing pads (not shown), slurry supply units 240, rotation arms 250, a wafer exchange unit 260, and a transfer robot 270. In an implementation, the semiconductor apparatus may further include a pad conditioner for maintaining a constant polishing rate by adjusting surface roughness of the polishing pads. The semiconductor apparatus may further include a cleaning solution supply unit.

The polishing pads may be mounted on the platens 210, respectively. The slurry supply unit 240 and the cleaning solution supply unit may be on each of the platens 210.

The rotation arms 250 may extend radially from a rotary shaft 255. When the rotary shaft 255 rotates, the rotation arms 250 may be rotated.

The polishing heads 220 may be installed to the rotatable rotation arms 250 and may be moved onto the platens 210. The polishing heads 220 may perform an elevating operation and a rotation operation independently of each other. The wafer exchange unit 260 may transfer or carry out a substrate to be polished. The transfer robot 270 may receive a substrate from the outside of the process chamber 200, e.g., a cleaning chamber or a deposition chamber, and may transfer the received substrate to the wafer exchange unit 260 of the process chamber 200.

In an implementation, the first planarization process described above with reference to FIG. 5 may be performed on a first platen of the platens 210. The first planarization process may be performed using the first slurry on the first platen, and then, a chemical rinsing or cleaning process may be performed using a cleaning solution. Next, the substrate may be transferred onto a second platen of the platens 210, and the second planarization process described above with reference to FIG. 6 may be performed on the substrate. After the second planarization process using the second slurry, a chemical rinsing or cleaning process may be performed using a cleaning solution.

Figure 8:
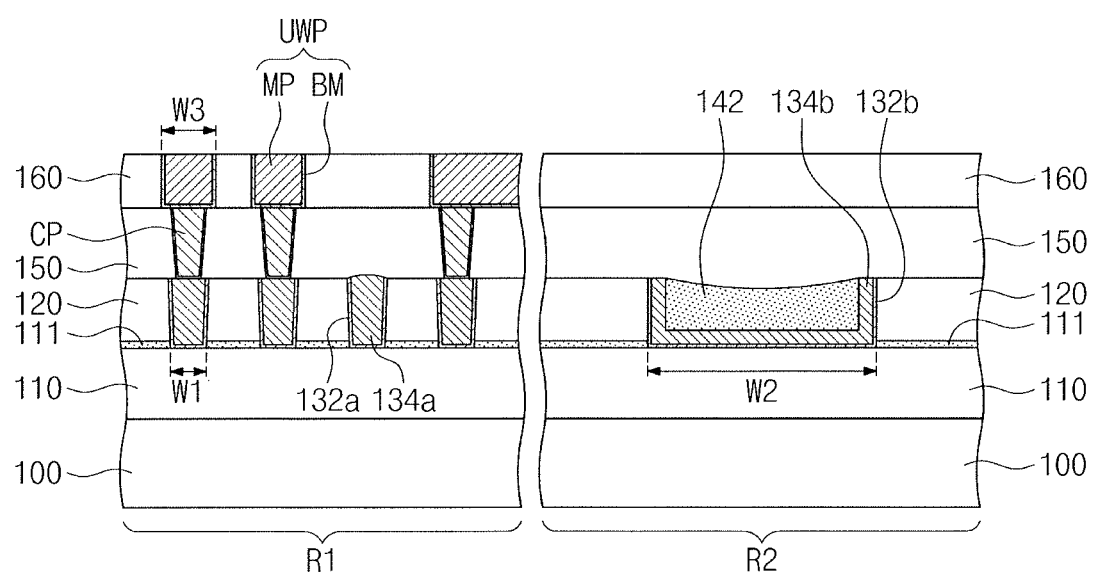
FIGS. 8 and 9 illustrate cross-sectional views of semiconductor devices according to some embodiments.
Figure 9:
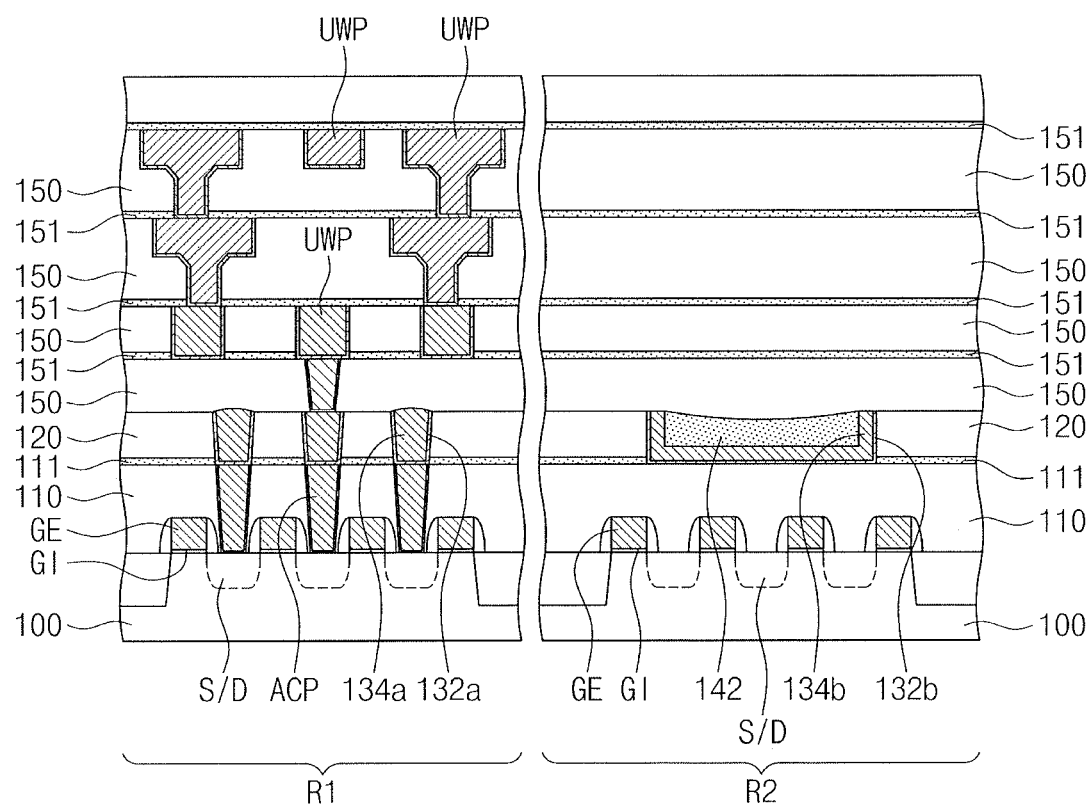

FIGS. 8 and 9 illustrate cross-sectional views of semiconductor devices according to some embodiments. For the purpose of ease and convenience in explanation, repeated descriptions of the same features and/or components as in the embodiments of FIGS. 1 to 7 may be omitted or mentioned briefly, and differences between the present embodiments and the embodiments of FIGS. 1 to 7 will be mainly described.

Referring to FIG. 8, the semiconductor substrate 100 may include the first and second regions R1 and R2. As described above with reference to FIGS. 1 to 7, the first metal patterns 134a may be formed in the interlayer insulating layer 120 on the first region R1, and the second metal pattern 134b and the filling pattern 142 may be formed in the interlayer insulating layer 120 on the second region R2. The first metal patterns 134a may be line patterns having the first widths W1, and the second metal pattern 134b may be a line pattern having the second width W2 that is greater than the first width W1.

A first upper insulating layer 150 may be on the interlayer insulating layer 120 and may cover the first and second metal patterns 134a and 134b and the filling pattern 142.

Contact plugs CP may penetrate the first upper insulating layer 150 on the first region R1 so as to be selectively connected to the first metal patterns 134a. Each of the contact plugs CP may include a barrier metal layer and a metal layer. In an implementation, the metal layer of the contact plug CP may be formed of a different metal material from that of the first metal pattern 134a. For example, the contact plugs CP may include a metal material such as tantalum (Ta), titanium (Ti), tungsten (W), nickel (Ni), or aluminum (Al).

A second upper insulating layer 160 may be on the first upper insulating layer 150, and upper interconnection lines UWP may be in the second upper insulating layer 160 on the first region R1. The upper interconnection lines UWP may be in contact with the contact plugs CP and may have a third width W3 that is greater than the first width W1 of the first metal pattern 134a.

The upper interconnection lines UWP may include a second metal material that is different from a first metal material of the first and second metal patterns 134a and 134b. An electron mean free path of the second metal material may be greater than an electron mean free path of the first metal material. In an implementation, the first metal material may be ruthenium (Ru), and the second metal material may be copper (Cu). Each of the upper interconnection lines UWP may include a barrier metal layer BM and a metal layer MP, and the metal layer MP may include copper or a copper alloy.

Referring to FIG. 9, a plurality of first transistors may be on the first region R1 of the semiconductor substrate 100, and a plurality of second transistors may be on the second region R2 of the semiconductor substrate 100.

For example, gate electrodes GE may be on the first and second regions R1 and R2 of the semiconductor substrate 100, and a gate insulating layer GI may be between the semiconductor substrate 100 and each of the gate electrodes GE. Source/drain regions S/D may be formed in the semiconductor substrate 100 at both sides of each of the gate electrodes GE. The source/drain regions S/D may include N-type or P-type dopants.

A lower layer 110 may fill spaces between the gate electrodes GE and may cover the source/drain regions S/D. Active contact patterns ACP may penetrate the lower layer 110 on the first region R1 so as to be connected to the source/drain regions S/D. Each of the active contact patterns ACP may include a barrier metal layer and a metal layer and may further include a metal silicide layer disposed between the barrier metal layer and the source/drain region S/D. The barrier metal layer may include a conductive metal nitride, e.g., titanium nitride, tantalum nitride, or tungsten nitride. The metal layer may include a metal material, e.g., cobalt (Co), titanium (Ti), tantalum (Ta), ruthenium (Ru), tungsten (W), or cobalt-tungsten-phosphorus (CoWP).

In an implementation, the etch stop layer 111 and the interlayer insulating layer 120, described above, may be sequentially stacked on the lower layer 110. As described above, the first metal patterns 134a may be in the interlayer insulating layer 120 on the first region R1, and the second metal pattern 134b and the filling pattern 142 may be in the interlayer insulating layer 120 on the second region R2.

In an implementation, the first metal patterns 134a may be interconnection lines electrically connected to the source/drain regions S/D through the active contact patterns ACP. The second metal pattern 134b may overlap with the second transistors on the second region R2. The second metal pattern 134b may be used as a resistor on the second region R2. In certain embodiments, the second metal pattern 134b may be a dummy pattern which is not electrically connected to the second transistors.

A plurality of upper insulating layers 150 may be stacked on the interlayer insulating layer 120 of the first and second regions R1 and R2. Upper etch stop layers 151 may be between the upper insulating layers 150. The upper insulating layers 150 may be formed of a low-k dielectric material of which a dielectric constant is lower than that of silicon oxide. The upper insulating layers 150 may have a dielectric constant of about 1.0 to about 3.0 and may include, e.g., an organic material, an inorganic material, or an organic-inorganic hybrid material.

Upper interconnection lines UWP may be vertically stacked in the upper insulating layers 150 on the first region R1. At least one of the upper interconnection lines UWP may include a via portion and a line portion. At least one of the upper interconnection lines UWP may be connected to the first metal pattern 134a through a contact plug. A width of the line portion of the upper interconnection line UWP may be greater than a width of the first metal pattern 134a.

The upper interconnection lines UWP may include a second metal material that is different from a first metal material of the first metal pattern 134a. An electron mean free path of the second metal material may be greater than an electron mean free path of the first metal material. In an implementation, the upper interconnection lines UWP may include copper or a copper alloy. In an implementation, the copper alloy may include copper with a very small amount of, e.g., C, Ag, Co, Ta, In, Sn, Zn, Mn, Ti, Mg, Cr, Ge, Sr, Pt, Mg, Al, or Zr. In an implementation, the upper interconnection lines UWP may include a metal (e.g., tungsten, titanium, or tantalum) or a conductive metal nitride (e.g., titanium nitride, tantalum nitride, or tungsten nitride).

In the semiconductor device according to some embodiments, the first metal pattern 134a may have the minimum line width. For example, the widths of the first metal patterns 134a may be less than widths of lower interconnection lines and widths of the upper interconnection lines UWP.

Figure 10:
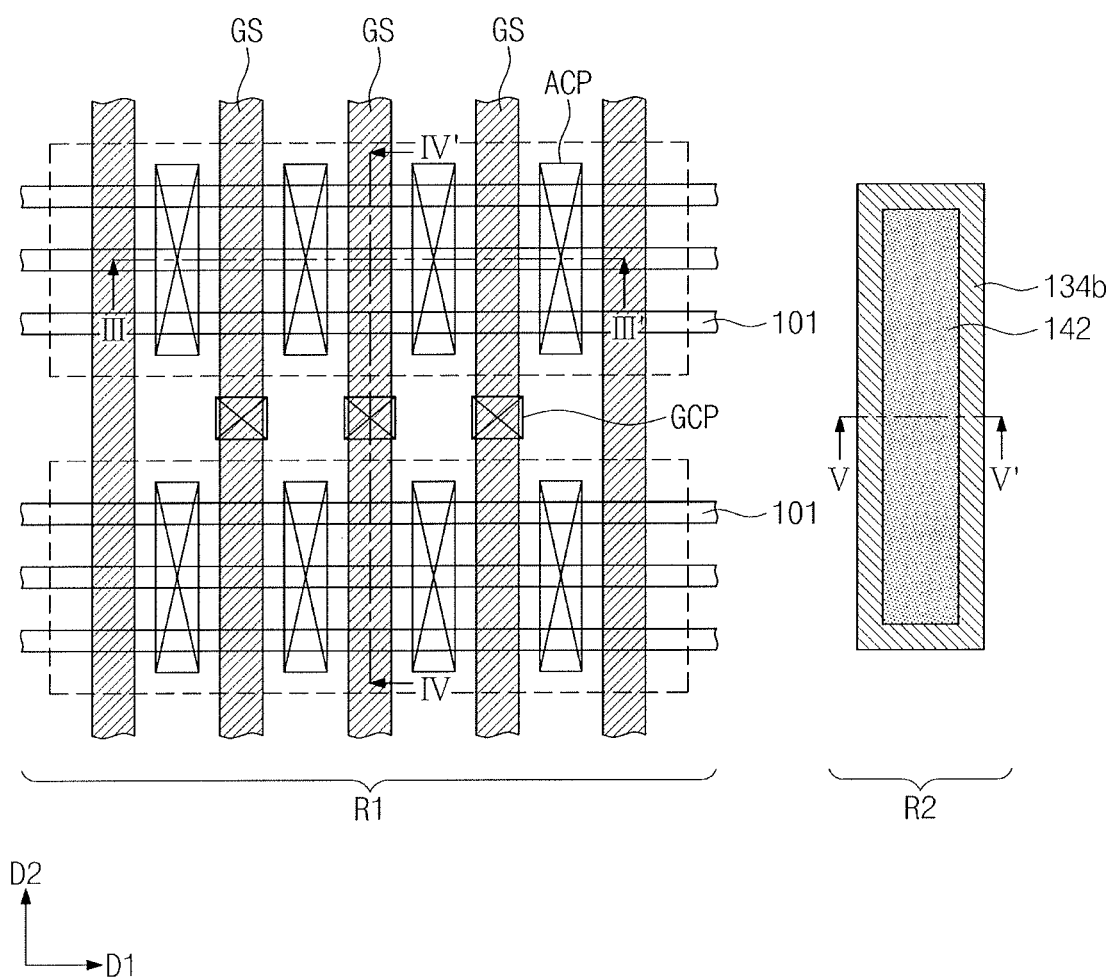
FIG. 10 illustrates a plan view of a semiconductor device according to some embodiments.
Figure 11:
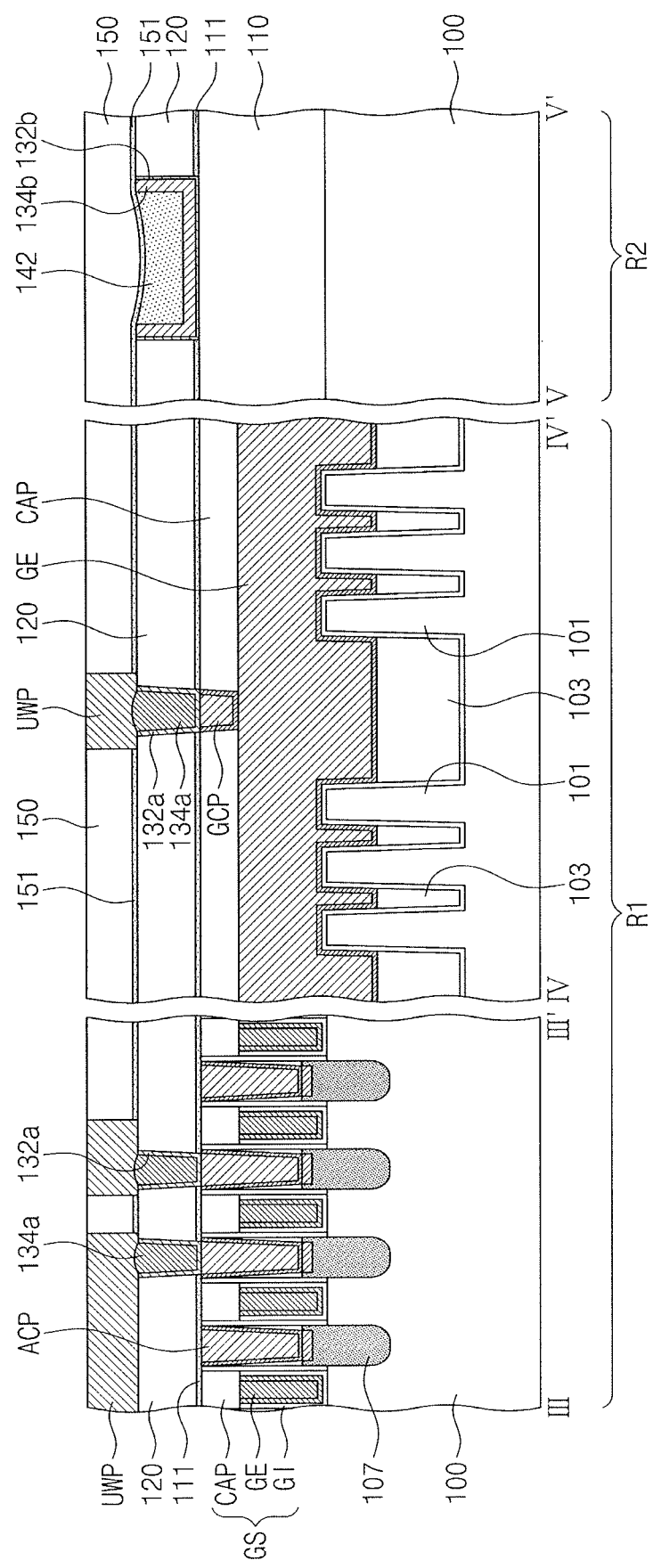
FIG. 11 illustrates a cross-sectional view taken along lines IV-IV' and V-V' of FIG. 10 of a semiconductor device according to some embodiments.

FIG. 10 illustrates a plan view of a semiconductor device according to some embodiments. FIG. 11 illustrates a cross-sectional view taken along lines IV-IV' and V-V' of FIG. 10 of a semiconductor device according to some embodiments.

Referring to FIGS. 10 and 11, a semiconductor substrate 100 may include a first region R1 and a second region R2. Logic components (e.g., an AND circuit, an OR circuit, a NOR circuit, an inverter, or a latch circuit) may be provided on the first region R1 of the semiconductor substrate 100. The logic components may include field effect transistors and a resistor. A monitoring pattern such as an alignment key or a photo key may be provided on the second region R2 of the semiconductor substrate 100.

For example, the first region R1 of the semiconductor substrate 100 may include a plurality of active patterns 101. The active patterns 101 may be portions of the semiconductor substrate 100 and may be defined by trenches formed in the semiconductor substrate 100. The active patterns 101 may extend in the first direction D1 and may be spaced apart from each other in the second direction D2 intersecting the first direction D1.

A device isolation layer 103 may be between the active patterns 101 adjacent to each other in the second direction D2. A top surface of the device isolation layer 103 may be lower than top surfaces of the active patterns 101, and the active patterns 101 may protrude upward from the top surface of the device isolation layer 103.

Gate structures GS may be on the first region R1 of the semiconductor substrate 100. The gate structures GS may extend in the second direction D2 to intersect the active patterns 101 and may be spaced apart from each other in the first direction D1. The gate structures GS may have substantially the same width and may be spaced apart from each other at equal distances.

Each of the gate structures GS may include a gate insulating layer GI, a metal gate electrode GE, and a capping insulating pattern CAP. Gate spacers may be on both sidewalls of each of the gate structures GS.

The gate insulating layer GI may be between the metal gate electrode GE and the active patterns 101 and may extend between the metal gate electrode GE and the gate spacers. For example, the gate insulating layer GI may extend from a bottom surface of the metal gate electrode GE onto both sidewalls of the metal gate electrode GE. In an implementation, the gate insulating layer GI may be locally disposed between the active pattern 101 and the bottom surface of the metal gate electrode GE. The gate insulating layer GI may include a high-k dielectric material of which a dielectric constant is greater than that of silicon oxide. In an implementation, the gate insulating layer GI may include a metal oxide, a metal silicate, or a metal silicate nitride.

The metal gate electrode GE may include a gate barrier metal pattern and a gate metal pattern. The gate barrier metal pattern may be between the gate insulating layer GI and the gate metal pattern and may extend between the gate metal pattern and the gate spacers. The gate barrier metal pattern may include a conductive metal nitride, e.g., titanium nitride, tantalum nitride, or tungsten nitride. The gate metal pattern may include a metal material, e.g., tungsten, aluminum, titanium, or tantalum.

In an implementation, the capping insulating pattern CAP may cover a top surface of the metal gate electrode GE between a pair of the gate spacers. In an implementation, the capping insulating pattern CAP may cover the top surface of the metal gate electrode GE and top surfaces of the gate spacers. In an implementation, the capping insulating patterns CAP and the gate spacers may include, e.g., silicon oxide, silicon nitride, silicon oxynitride, silicon carbonitride (SiCN), or silicon-carbon oxynitride (SiCON).

Source/drain dopant layers 107 may be in the active patterns 101 at both sides of each of the gate structures GS. The source/drain dopant layers 107 may include N-type or P-type dopants. The source/drain dopant layers 107 may be epitaxial layers grown from the active patterns 101. In an implementation, the source/drain dopant layer 107 may be a silicon-germanium (SiGe) epitaxial layer or a silicon carbide (SiC) epitaxial layer.

A lower layer 110 may fill spaces between the gate structures GS on the first region R1 and may cover the second region R2 of the semiconductor substrate 100. A top surface of the lower layer 110 may be substantially coplanar with top surfaces of the gate structures GS.

Active contact patterns ACP may penetrate the lower layer 110 between the gate structures GS so as to be connected to the source/drain dopant layers 107. Each of the active contact patterns ACP may be connected to one source/drain dopant layer 107 or may be connected in common to a plurality of the source/drain dopant layers 107. The active contact patterns ACP may include, e.g., cobalt (Co), titanium (Ti), tantalum (Ta), ruthenium (Ru), tungsten (W), or cobalt-tungsten-phosphorus (CoWP).

Gate contact patterns GCP may be connected to the metal gate electrodes GE. The gate contact patterns GCP may be formed simultaneously with the active contact patterns ACP and may include the same metal material as the active contact patterns ACP.

The etch stop layer 111 and the interlayer insulating layer 120, described with reference to FIGS. 1 to 6, may fully cover the semiconductor substrate 100 with uniform thicknesses. The etch stop layer 111 may cover top surfaces of the active contact patterns ACP and top surfaces of the gate contact patterns GCP on the first region R1.

As described with reference to FIGS. 1 to 6, first metal patterns 134*a* may be in the interlayer insulating layer 120 on the first region R1, and a second metal pattern 134*b* and a filling pattern 142 may be in the interlayer insulating layer 120 on the second region R2.

In the present embodiments, the first metal patterns 134*a* may be contact plugs connected to at least one of the active contact patterns ACP and at least one of the gate contact patterns GCP. The first metal patterns 134*a* may be in contact with the active contact pattern ACP and the gate contact pattern GCP. In an implementation, the first metal patterns 134*a* may be formed of a metal material having an electron mean free path that is less than a width (or a diameter) of the first metal pattern 134*a*.

An upper insulating layer 150 may be on the interlayer insulating layer 120, and upper interconnection lines UWP may be in the upper insulating layer 150 on the first region R1. The upper interconnection line UWP may include a metal material of which a resistivity is less than that of the first metal pattern 134*a*. The upper interconnection line UWP may include a barrier metal layer and a metal layer, and the metal layer may include, e.g., copper or a copper alloy.

Figure 12:
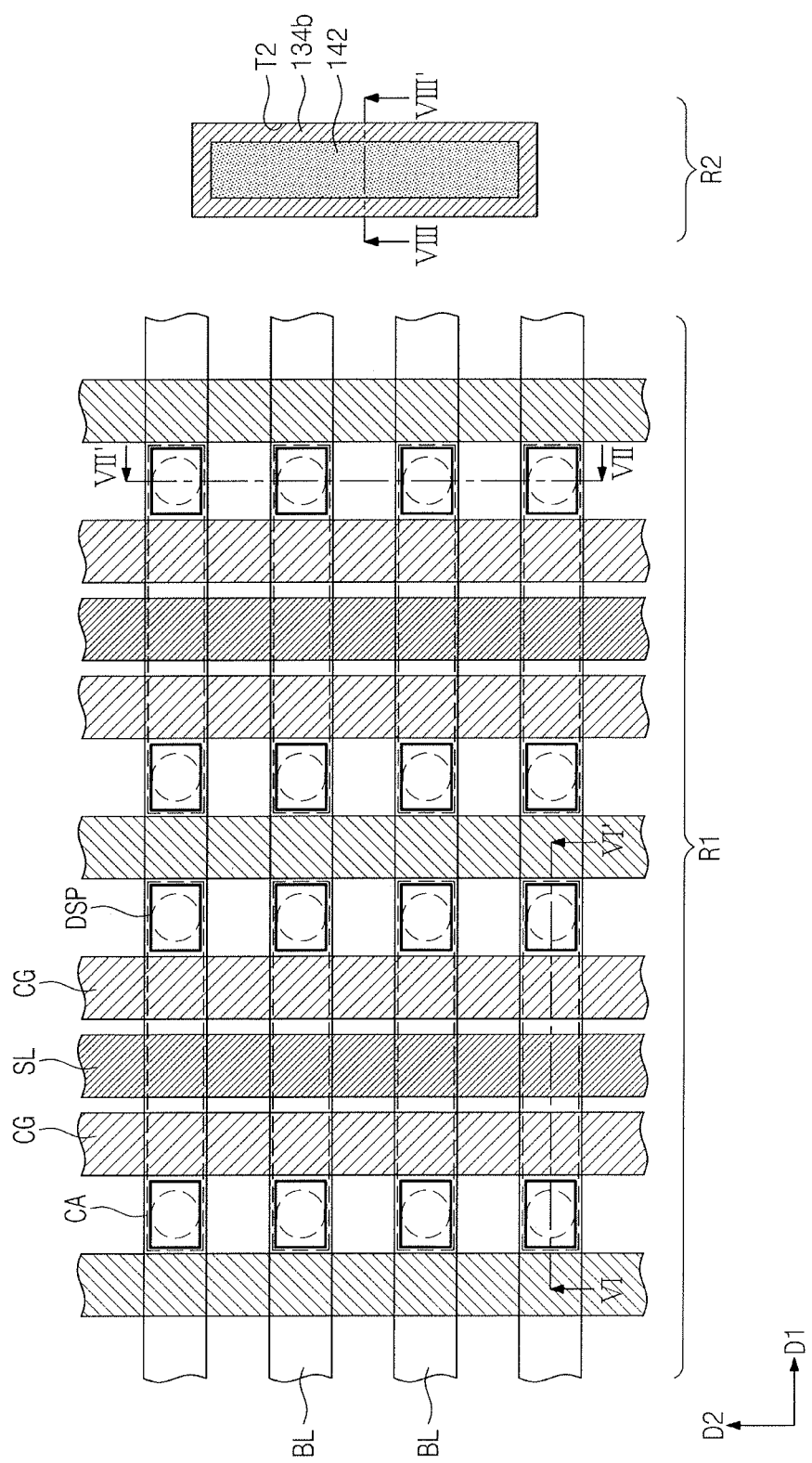
FIG. 12 illustrates a plan view of a semiconductor memory device according to some embodiments.
Figure 13:
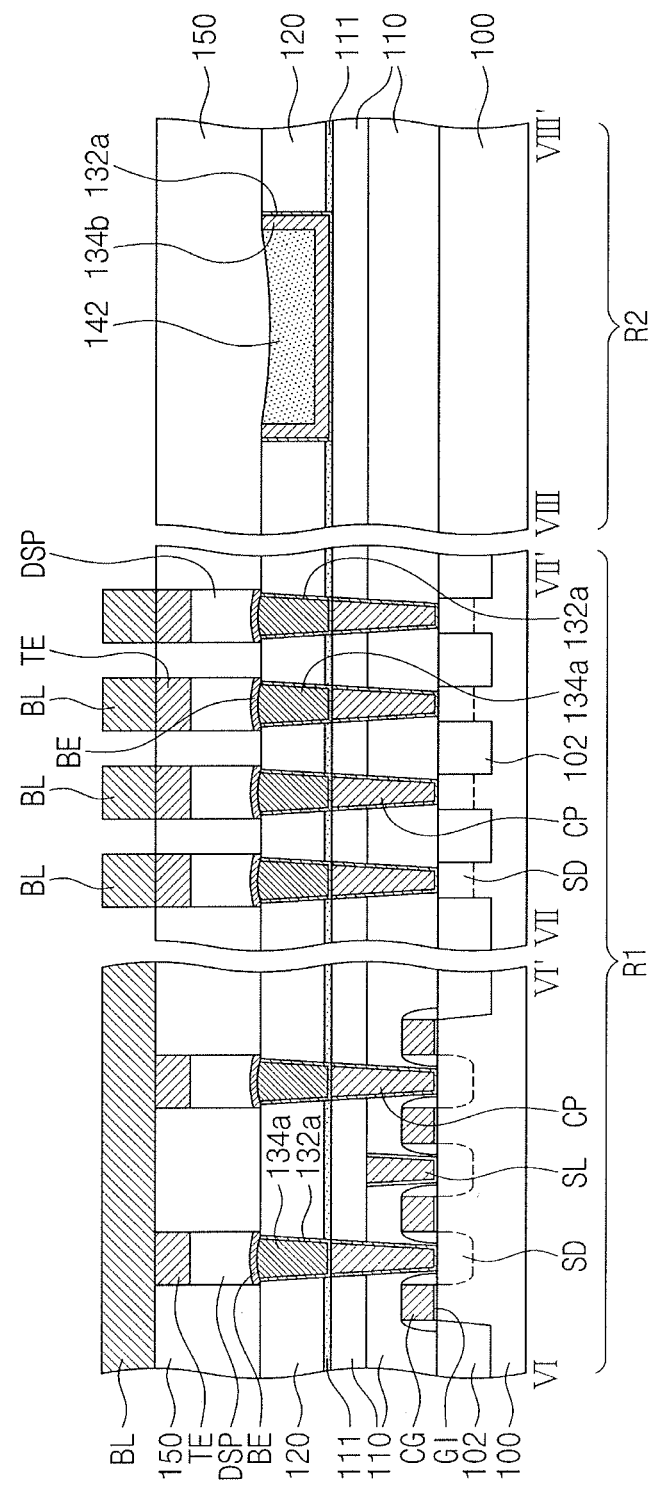
FIGS. 13 and 14 illustrate cross-sectional views taken along lines VI-VI', VII-VII' and VIII-VIII' of FIG. 12 of semiconductor memory devices according to some embodiments.
Figure 14:
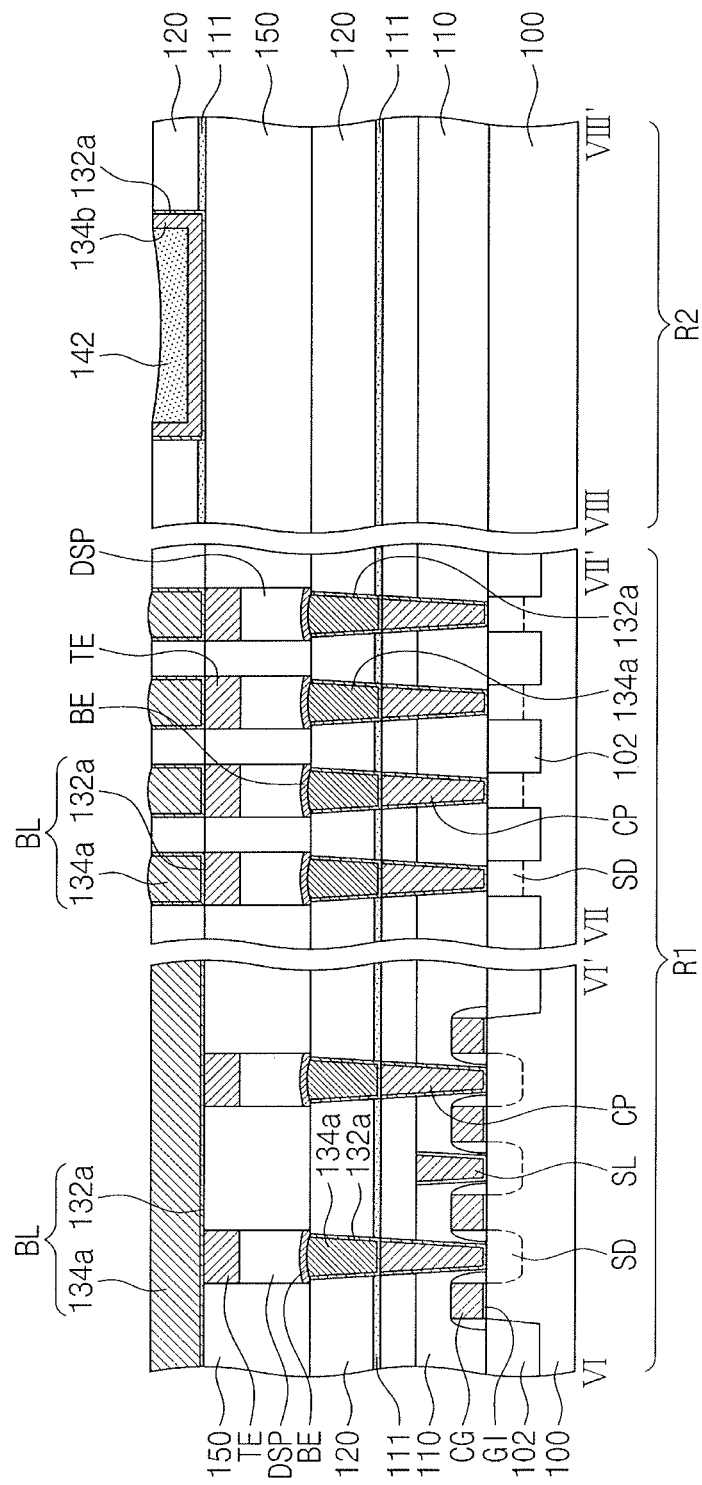

FIG. 12 illustrates a plan view of a semiconductor memory device according to some embodiments. FIGS. 13 and 14 illustrate cross-sectional views taken along lines VI-VI', VII-VII' and VIII-VIII' of FIG. 12 of semiconductor memory devices according to some embodiments.

Referring to FIGS. 12 and 13, a memory cell array may be formed on a first region R1 of a semiconductor substrate 100, and peripheral circuit patterns (e.g., logic cells, an alignment key, or a photo key) may be formed on a second region R2 of the semiconductor substrate 100. For example, the first region R1 may be a memory cell array region, and the second region R2 may be a peripheral circuit region or a scribe line region.

Selection transistors (used as selection components of memory cells) may be formed on the first region R1 of the semiconductor substrate 100. The selection transistors may include cell active patterns CA, cell gate electrodes CG intersecting the cell active patterns CA, and source/drain regions SD formed in the cell active patterns CA at both sides of each of the cell gate electrodes CG.

For example, device isolation patterns 102 defining the cell active patterns CA may be formed in the first region R1 of the semiconductor substrate 100. Each of the cell active patterns CA may be defined between the device isolation patterns 102 adjacent to each other. In an implementation, the cell active patterns CA may have line or bar shapes having long axes in the first direction D1. The cell active patterns CA may include dopants of a first conductivity type.

The cell gate electrodes CG may intersect the cell active patterns CA and the device isolation patterns 102 on the first region R1 of the semiconductor substrate 100. The cell gate electrodes CG may have line shapes extending in a second direction D2. A gate insulating layer GI may be between the cell gate electrode CG and the semiconductor substrate 100.

In an implementation, the cell gate electrodes CG may include, e.g., a semiconductor material doped with dopants, a metal, a conductive metal nitride, or a metal-semiconductor compound. The gate insulating layer GI may include, e.g., silicon oxide, silicon nitride, silicon oxynitride, or a high-k dielectric material.

The source/drain regions SD may be in the cell active patterns CA at both sides of each of the cell gate electrodes CG. The source/drain regions SD may be doped with dopants of a second conductivity type (e.g., an N-type) different from the first conductivity type (e.g., a P-type) of the cell active patterns CA.

A lower layer 110 may fully cover the first region R1 and the second region R2 of the semiconductor substrate 100. The lower layer 110 may cover the selection transistors.

Source lines SL may penetrate at least a portion of the lower layer 110 on the first region R1 and may be connected to some of the source/drain regions SD. The source lines SL may extend in parallel to the cell gate electrodes CG. Each of the source lines SL may be between the cell gate electrodes CG adjacent to each other when viewed in a plan view. In an implementation, a top surface of the source line SL may be covered by the lower layer 110. Contact plugs CP may penetrate the lower layer 110 on the first region R1 and may be electrically connected to others of the source/drain regions SD, respectively.

In an implementation, the source lines SL and the contact plugs CP may include a metal (e.g., tungsten, titanium, or tantalum) or a conductive metal nitride (e.g., titanium nitride, tantalum nitride, or tungsten nitride). In an implementation, the source lines SL and the contact plugs CP may include a semiconductor material doped with dopants.

The etch stop layer 111 and the interlayer insulating layer 120, described with reference to FIGS. 1 to 6, may be sequentially stacked on the lower layer 110. First metal patterns 134*a* may be in the interlayer insulating layer 120 on the first region R1, and a second metal pattern 134*b* and a filling pattern 142 may be in the interlayer insulating layer 120 on the second region R2. In an implementation, the first metal patterns 134*a* may be contact plugs connected to the contact plugs CP, respectively.

Data storage patterns DSP may be formed on the interlayer insulating layer 120 of the first region R1. The data storage patterns DSP may be spaced apart from each other and may be arranged in the first and second directions D1 and D2 intersecting each other when viewed in a plan view. The data storage patterns DSP may be connected to the first metal patterns 134*a*, respectively. The data storage patterns DSP may be electrically connected to the others of the source/drain regions SD through the first metal patterns 134a and the contact plugs CP, respectively. For example, the data storage patterns DSP may be electrically connected to the selection transistors, respectively.

A bottom electrode BE may be between the data storage pattern DSP and the first metal pattern 134a. A top electrode TE may be on a top surface of the data storage pattern DSP. The top electrode TE, the data storage pattern DSP, and the bottom electrode BE may have sidewalls aligned with each other.

The bottom electrode BE and the top electrode TE may include a conductive metal nitride. In an implementation, the bottom electrode BE and the top electrode TE may include, e.g., titanium nitride (TiN), tantalum nitride (TaN), tungsten nitride (WN), or titanium-aluminum nitride (TiAlN).

An upper insulating layer 150 may be formed on the interlayer insulating layer 120 to fill a space between the data storage patterns DSP. The upper insulating layer 150 may be deposited with a uniform thickness on the first region R1 and the second region R2. The upper insulating layer 150 may cover top surfaces of the second metal pattern 134b and the filling pattern 142 on the second region R2.

Bit lines BL may be on the upper insulating layer 150 of the first region R1. Each of the bit lines BL may be in contact with the top electrodes TE arranged in the first direction D1.

Referring to FIG. 14, first metal patterns 134a may be provided as bit lines BL on the first region R1. The second metal pattern 134b may be located at the same level as the bit lines BL of the first region R1.

For example, an etch stop layer 111 and an interlayer insulating layer 120 may be on the upper insulating layer 150, and the first metal patterns 134a used as the bit lines BL may be in the interlayer insulating layer 120 of the first region R1. For example, each of the first metal patterns 134a used as the bit lines BL may be connected to the top electrodes TE arranged in the first direction.

In an implementation, the first metal patterns 134a may have the minimum line width in the semiconductor memory device.

Figure 15:
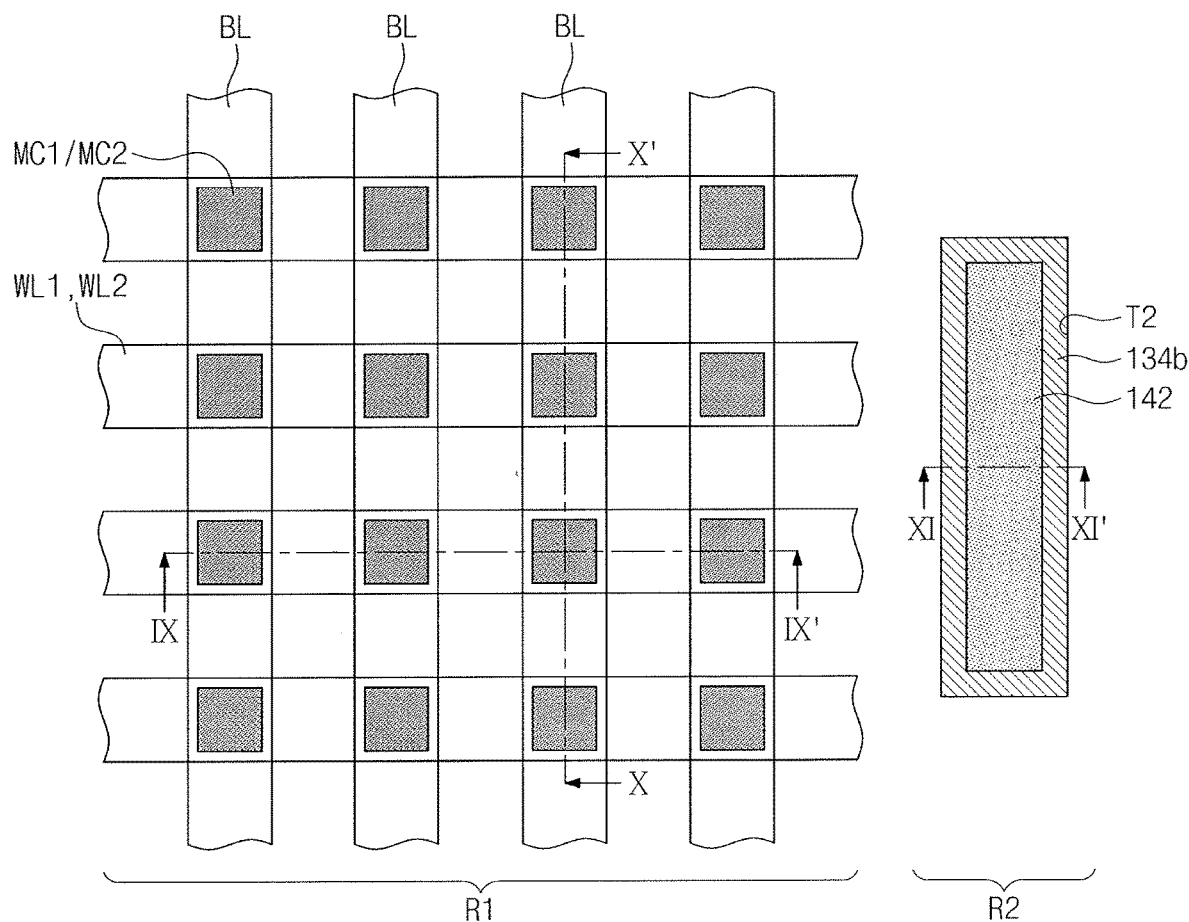
FIG. 15 illustrates a plan view of a semiconductor memory device according to some embodiments.
Figure 16:
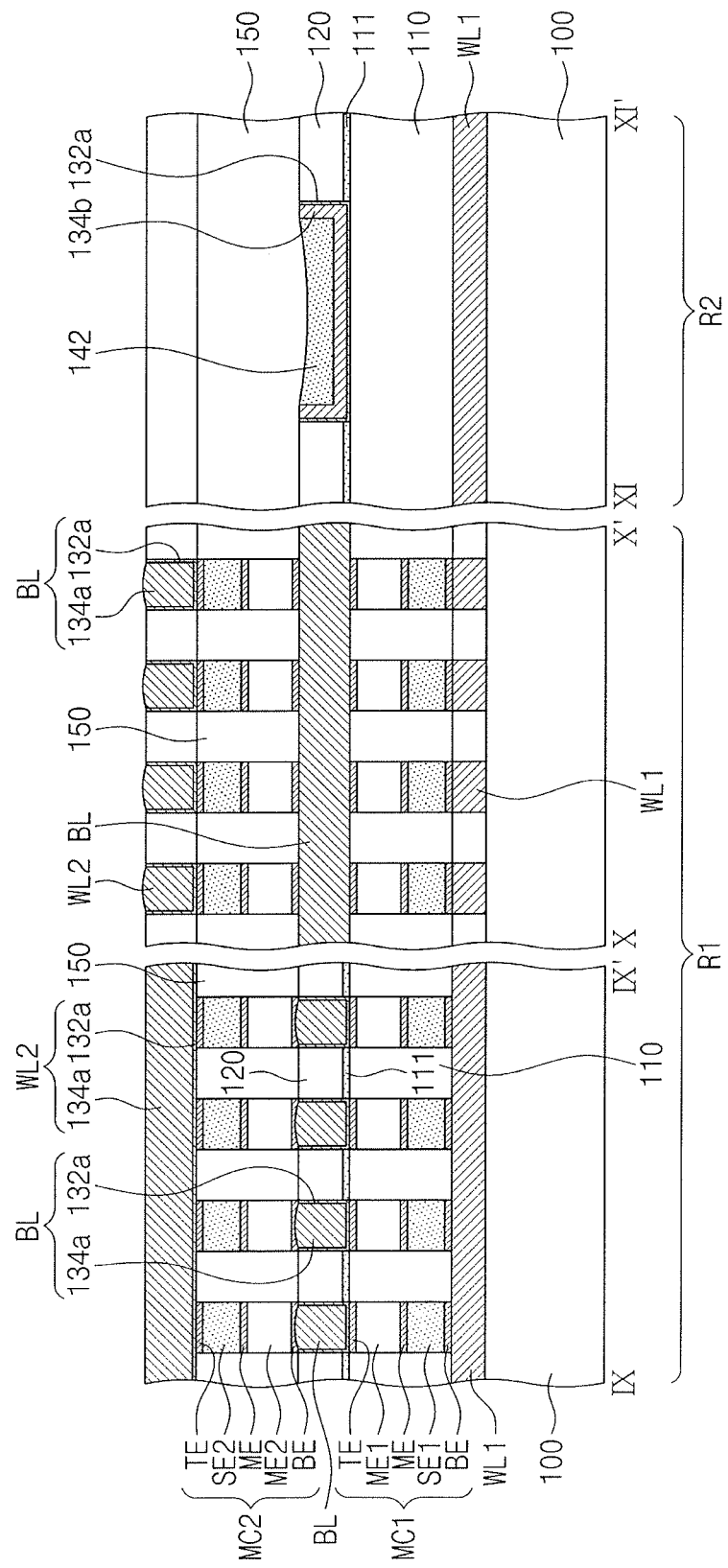
FIG. 16 illustrates a cross-sectional view taken along lines IX-IX', X-X' and XI-XI' of FIG. 15 of a semiconductor memory device according to some embodiments.

FIG. 15 illustrates a plan view of a semiconductor memory device according to some embodiments. FIG. 16 illustrates a cross-sectional view taken along lines IX-IX', X-X' and XI-XI' of FIG. 15 of a semiconductor memory device according to some embodiments.

Referring to FIGS. 15 and 16, a semiconductor memory device according to some embodiments may include a cross-point memory cell array. The memory cell array may include word lines WL1 and WL2, bit lines BL, and memory cells MC1 and MC2 at crossing points of the bit lines BL and the word lines WL1 and WL2.

In an implementation, first word lines WL1 may be on a top surface of a semiconductor substrate 100, and second word lines WL2 may be vertically spaced apart from the first word lines WL1. The bit lines BL may be between the first word lines WL1 and the second word lines WL2 when viewed in a cross-sectional view.

In an implementation, the first word lines WL1, the bit lines BL and the second word lines WL2 may include, e.g., a semiconductor material doped with dopants (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

First memory cells MC1 may be at crossing points of the first word lines WL1 and the bit lines BL, respectively. Second memory cells MC2 may be at crossing points of the second word lines WL2 and the bit lines BL, respectively. In an implementation, the first and second memory cells MC1 and MC2 may share the bit lines BL. In an implementation, one of the first and second memory cells MC1 and MC2 may be selected by one selected among the first and second word lines WL1 and WL2 and one selected among the bit lines BL.

Each of the first and second memory cells MC1 and MC2 may include a memory component ME1 or ME2 and a switching component SE1 or SE2, and the switching component SE1 or SE2 and the memory component ME1 or ME2 may be electrically connected in series to each other. In each of the first and second memory cells MC1 and MC2, the switching component SE1 or SE2 and the memory component ME1 or ME2 may be disposed between a bottom electrode BE and a top electrode TE, and a middle electrode ME may be disposed between the memory component ME1 or ME2 and the switching component SE1 or SE2.

In the embodiments illustrated in FIGS. 15 and 16, the bit lines BL and the second word lines WL2 may include the first metal patterns 134a described with reference to FIGS. 1 to 6. For example, the first metal pattern 134a may be between the first memory cell MC1 and the second memory cell MC2 which are vertically stacked on the first region R1. In addition, the second barrier metal pattern 132b and the second metal pattern 134b may be formed at the same level as the bit lines BL or the second word lines WL2.

By way of summation and review, resistances of interconnection lines and a capacitance between the interconnection lines may be increased by a reduction in critical dimension (CD), and it could be difficult to operate semiconductor devices at high speed. Various methods for forming semiconductor devices that have excellent performance while overcoming limitations by the high integration have been considered.

In the semiconductor device and the method of fabricating the same according to some embodiments, the opening having a wide width on the second region may be completely filled with the metal layer and the filling layer, and the metal patterns having small widths or diameters and including (e.g., only) the noble metal material may be formed on the first region. For example, the polishing time of the metal layer including the noble metal material on the second region may be reduced.

In addition, the filling layer may be formed of the non-metal material, and it is possible to prevent occurrence of erosion between the metal layer and the filling layer on the second region during the formation of the metal patterns on the first region.

One or more embodiments may provide a semiconductor device including a metal pattern that contains ruthenium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a semiconductor substrate including a first region and a second region;
an interlayer insulating layer on the semiconductor substrate, the interlayer insulating layer including:
a first opening on the first region and having a first width; and
a second opening on the second region and having a second width, the second width being greater than the first width;
at least one first metal pattern filling the first opening;
a second metal pattern in the second opening; and
a filling pattern on the second metal pattern in the second opening,
wherein:
the at least one first metal pattern and the second metal pattern each include a same first metal material,
the filling pattern is formed of a material that includes at least one element that is not a metal, and
a top surface of the at least one first metal pattern is located at the substantially same level as a top surface of the interlayer insulating layer or at a higher level than the top surface of the interlayer insulating layer.

2. The semiconductor device as claimed in claim 1, wherein:
the second metal pattern includes:
a bottom portion covering a bottom surface of the second opening, and
a sidewall portion extending from the bottom portion to cover a sidewall of the second opening, and
a thickness of the bottom portion is greater than half of the first width of the first opening and is less than the first width of the first opening.

3. The semiconductor device as claimed in claim 1, wherein the first metal material of the at least one first metal pattern and the second metal pattern includes ruthenium (Ru).

4. The semiconductor device as claimed in claim 1, wherein the filling pattern includes:
a first element including oxygen, nitrogen, or carbon; and
a second element including a metal element or a semiconductor element.

5. The semiconductor device as claimed in claim 1, wherein the filling pattern includes titanium nitride, silicon oxide, silicon nitride, silicon oxynitride, silicon carbide, silicon carbonitride, silicon-carbon oxynitride, SiOCH, or SiOF.

6. The semiconductor device as claimed in claim 1, wherein an electron mean free path of the first metal material is less than the first width.

7. The semiconductor device as claimed in claim 1, wherein the top surface of the at least one first metal pattern is farther from the semiconductor substrate than a top surface of the filling pattern.

8. The semiconductor device as claimed in claim 1, wherein:
the top surface of the at least one first metal pattern is a rounded top surface that is upwardly convex and at the higher level than the top surface of the interlayer insulating layer, and
the filling pattern has a rounded top surface that is downwardly concave.

9. The semiconductor device as claimed in claim 1, further comprising:
an upper insulating layer on the interlayer insulating layer; and
upper interconnection lines in the upper insulating layer, the upper interconnection lines having a third width that is greater than the first width,
wherein the upper interconnection lines include a second metal material that is different from the first metal material.

10. The semiconductor device as claimed in claim 9, wherein:
the at least one first metal pattern has a line shape extending in one direction and is provided in plurality, and
the plurality of first metal patterns each have a line width in the semiconductor device.

11. The semiconductor device as claimed in claim 1, further comprising memory cells on the first region of the semiconductor substrate,
wherein:
the at least one first metal pattern has a line shape extending in one direction and is provided in plurality, and
the plurality of first metal patterns are electrically connected to the memory cells.

12. The semiconductor device as claimed in claim 1, further comprising:
gate structures on the first region of the semiconductor substrate; and
source/drain dopant layers in the semiconductor substrate at both sides of each of the gate structures,
wherein:
the at least one first metal pattern is provided in plurality in the interlayer insulating layer of the first region, and
each first metal pattern of the plurality of first metal patterns is connected to a respective gate structure of the gate structures and a respective source/drain dopant layer of the source/drain dopant layers.

13. A semiconductor device, comprising:
a semiconductor substrate including a first region and a second region;
an interlayer insulating layer including:
a first trench on the first region, the first trench having a first width, and
a second trench on the second region, the second trench having a second width that is greater than the first width;
a first metal pattern filling the first trench;
a second metal pattern filling a portion of the second trench; and
a filling pattern filling a remaining portion of the second trench having the second metal pattern therein,
wherein:
the first metal pattern and the second metal pattern each include a metal material,
the filling pattern includes a material that includes at least one element that is not a metal, and
a top surface of the filling pattern is closer to the semiconductor substrate than a top surface of the first metal pattern.

14. The semiconductor device as claimed in claim 13, wherein the top surface of the filling pattern is closer to the semiconductor substrate than a highest point of the interlayer insulating layer.

15. The semiconductor device as claimed in claim 13, wherein:
the second metal pattern includes a bottom portion covering a bottom surface of the second trench and a sidewall portion extending from the bottom portion to cover a sidewall of the second trench, and thicknesses of the bottom portion and the sidewall portion are greater than half of the first width of the first trench and are less than the first width of the first trench.

16. The semiconductor device as claimed in claim 15, wherein a top surface of the sidewall portion of the second metal pattern is at a substantially same distance from the semiconductor substrate as the top surface of the first metal pattern.

17. The semiconductor device as claimed in claim 13, wherein the first metal pattern and the second metal pattern each include ruthenium.

18. The semiconductor device as claimed in claim 13, wherein the filling pattern includes a low-k dielectric material having a dielectric constant that is lower than that of the interlayer insulating layer.

19. The semiconductor device as claimed in claim 13, wherein the filling pattern includes titanium nitride, silicon oxide, silicon nitride, silicon oxynitride, silicon carbide, silicon carbonitride, silicon-carbon oxynitride, SiOCH, or SiOF.

20. A semiconductor device, comprising:
a semiconductor substrate including a first region and a second region;
an interlayer insulating layer on the semiconductor substrate, the interlayer insulating layer including:
a first opening on the first region and having a first width; and
a second opening on the second region and having a second width, the second width being greater than the first width;
at least one first metal pattern filling the first opening;
a second metal pattern in the second opening; and
a filling pattern on the second metal pattern in the second opening,
wherein:
the at least one first metal pattern and the second metal pattern each include a same first metal material,
the filling pattern is formed of a non-metal material,
the at least one first metal pattern has a rounded top surface that is upwardly convex, and
the filling pattern has a rounded top surface that is downwardly concave.

\* \* \* \* \*